United States Patent [19]
Yoshida

[11] Patent Number: 5,256,892
[45] Date of Patent: Oct. 26, 1993

[54] SEMICONDUCTOR MEMORY DEVICE WHEREIN GATE ELECTRODE THICKNESS IS GREATER IN THE MEMORY CELLS THAN IN THE PERIPHERAL CELLS

[75] Inventor: Naoyuki Yoshida, Tokyo, Japan

[73] Assignee: NEC Corporation, Japan

[21] Appl. No.: 722,847

[22] Filed: Jun. 28, 1991

[30] Foreign Application Priority Data

Jun. 29, 1990 [JP] Japan .................. 2-171476

[51] Int. Cl.⁵ .................. H01L 29/68; H01L 29/78; H01L 29/92
[52] U.S. Cl. .................. 257/306; 257/309; 257/413
[58] Field of Search ........... 257/306, 307, 308, 309, 257/303, 296, 413, 392; 365/149

[56] References Cited

U.S. PATENT DOCUMENTS

| | | | |
|---|---|---|---|
| 5,025,301 | 6/1991 | Shimizu | 257/296 |
| 5,028,990 | 7/1991 | Kotaki et al. | 257/306 |
| 5,057,449 | 10/1991 | Lowrey et al. | 437/60 |

*Primary Examiner*—Rolf Hille
*Assistant Examiner*—Robert Limanek
*Attorney, Agent, or Firm*—Laff, Whitesel, Conte & Saret

[57] ABSTRACT

An attempt was made to increase the film thickness of at least a portion of word lines over which a storage node electrode of the capacitor for storing charges extends in a DRAM having word lines, bit lines and memory cells comprising one transistor and one stacked capacitor for charge storage. This increases the surface area of the storage node electrode. This also increases the opposing areas of the storage node electrode and the cell plate electrode of the capacitor for storing charges. This invention realizes the increase in the surface area of the storage node electrode without imposing additional burden on processability.

26 Claims, 14 Drawing Sheets

SEMICONDUCTOR MEMORY DEVICE WHEREIN GATE ELECTRODE THICKNESS IS GREATER IN THE MEMORY CELLS THAN IN THE PERIPHERAL CELLS

BACKGROUND OF THE INVENTION

1. Field of the Invention

This invention relates to a semiconductor memory device, and more particularly to the shape of a storage node electrode in a charge storage type capacitor in a DRAM having memory cells comprising one transistor and one stacked capacitor for charge storage.

2. Description of the Prior Art

DRAM stores data in a capacitor for charge storage in the form of electric charges. In view of the stable operation and the memory retaining time of the DRAM, the capacitance of the capacitor for charge storage should preferably be as large as possible. But, on the other hand, the size of memory cells should be made as small as possible for higher integration of the DRAM. This reduces the projective plane area available for the capacitor. The projective plane area is smaller than the size of the memory cells. In order to solve the dilemma, the structure for the capacitor for charge storage in a DRAM having the memory cell of one transistor and one capacitor has undergone a change from the planer type to the trench type and further to the stacked type.

A typical example of such stacked type DRAM is disclosed in ISSCC DIGEST OF TECHNICAL PAPERS, pp. 250-251; February, 1985.

On the surface of a p-type silicon substrate is selectively provided field oxide films and active areas surrounded by the field oxide films. Gate insulation films are provided on the surface of the active areas. Plural word lines are provided substantially parallel to each other upon the field oxide films and the gate insulation films on the memory cell array of a DRAM. The word lines are formed with an N+ type polycrystal silicon film and the like. The N+ type diffused layer which is self-matched with the word lines is provided on the active area. The transistor of the memory cells comprises the N+ type diffused layer and the word lines. The field oxide films, the gate insulation films and the word lines are covered with the first insulation film between layers. The first insulation film may be formed with the silicon oxide film, for example, by CVD method. Node contact holes are formed between the word lines on the gate insulation film and the adjacent word lines on the field oxide film to extend to and reach the N+ type diffused layer. The storage node electrode is connected to the N+ diffused layer via the node contact holes, extends over the word lines on the gate insulation film via the first insulation film, and further over the word lines on the field oxide film adjacent to the word lines via the first insulation film simultaneously. The storage node electrode may be formed with an N+ type polycrystal silicon film. The storage node electrode is covered with the capacitance insulation film which in turn is covered with the cell plate electrode. The storage node electrode, the capacitance insulation film and the cell plate electrode form a capacitor for storing electric charge. The capacitor for storing electric charge and the first insulation film between layers are covered with the second insulation film between layers. Between the two word lines adjacent to each other within the same active area is provided a bit contact hole to extend to the N+ type diffused layer between these word lines. The substantially parallel plural bit lines on the second insulation film between layers are orthogonally intersecting word lines and connected to the N+ type diffused layer via the bit contact hole.

The aforementioned report does not mention about the structure of the peripheral circuitry of the memory cells, but it is generally formed as below. The field oxide films and active areas of the peripheral circuitry are formed simultaneously with the field oxide films and the active areas of the memory cells. The gate insulation film, the gate electrode and the N+ type diffused layer of the transistor which are the components of the peripheral circuitry are respectively formed simultaneously with the gate insulation film, the word lines and the N+ type diffused layer of the memory cells. The contact holes of the peripheral circuitry are formed simultaneously with the bit contact holes. The metal wiring of the peripheral circuitry is formed simultaneously with the bit lines.

Capacitance of the capacitor for storing electric charges is determined by the permittivity and the film thickness of the capacitance insulation film and the opposing areas of the two electrodes. The opposing areas are calculated by adding the surface areas of the top and the side faces of the storage node electrode.

When the size of the memory cells is further reduced in the capacitor for storing electric charges of the aforementioned structure, the capacitance decrease may be prevented by such methods as of further decreasing the film thickness of the capacitance insulation film, forming the capacitance insulation film with a material having a still higher permittivity, and increasing the opposing areas. These three methods are independent of each other. However, it is quite difficult to increase the opposing area without imposing an extra burden on the processibility of the storage node electrode.

BRIEF SUMMARY OF THE INVENTION

Objects of the Invention

An object of this invention is to provide a DRAM having memory cells which comprise one transistor and one capacitor for storing electric charges.

Another object of this invention is to provide a DRAM having memory cells comprising one transistor and one stacked capacitor for storing electric charges.

Another object of this invention is to provide a DRAM having high density memory cells.

Still another object of this invention is to provide a DRAM having high density memory cells and a capacitor for storing electric charges which has a high capacitance.

Still another object of this invention is to provide a DRAM having a storage node electrode of the capacitor for storing electric charges which has large opposing areas.

SUMMARY OF THE INVENTION

This invention relates to a semiconductor memory device of DRAM including on the field oxide films and the active areas selectively formed on the surface of a silicon substrate of one-conductivity type, a transistor including a gate as a part of a word line, a gate insulation film and a pair of opposite conductivity type diffused layers, a stacked capacitor for storing electric charges which extends over the two word lines on both sides of one of the opposite conductivity diffused layers and which has a storage node electrode connected to the opposite conductivity type diffused layer, memory cells having bit lines connected to the other opposite conductivity diffused layer, and a peripheral circuitry including a MOS transistor comprising a gate electrode, a gate insulation film and a pair of opposite conductivity diffused layers. The semiconductor memory device according to this invention is characterized in that the film thickness of at least one portion of the word lines is larger than the film thickness of the gate electrode. This increases the step gap formed by the word lines of the portion from that in the prior art to thereby increase the sum of the surface areas of the top and the side faces of the storage node electrode (or, in other words, opposing areas of the storage node electrodes and the cell plate electrodes of the stacked capacitor for charge storage), resulting in an increase in the capacitance of the capacitor for charge storage. No extra burden is imposed on the processibility when this structure is embodied. The word lines and the bit lines preferably intersect each other orthogonally.

The film thickness of word lines in the semiconductor memory device according to this invention is preferably made larger on at least one portion on the active areas and on at least one portion on the field oxide films at the voids on the active areas connected to the same bit line. This increases the step gap at the steps formed by the word lines at this portions larger than before to thereby increase the capacitance of the capacitor for charge storage.

The film thickness of the word lines in the semiconductor memory device according to this invention is preferably larger than that of the gate electrode. The step gap of the steps formed by the word lines at the portions is increased to thereby increase the capacitance of the capacitor for storing charges.

The thickness of the gate insulation film at the memory cells in this invention semiconductor memory device is preferably larger than that of the gate insulation film of the peripheral circuitry. The word lines and the gate electrode are preferably formed as a so-called polycide structure by lamination of the silicide film and the polycrystal silicon film, and another polycrystal silicon film is laminated further on the polycide structure at the portion of the word lines where the film thickness is larger.

BRIEF DESCRIPTION OF THE DRAWINGS

The above mentioned and other objects, features and advantages of this invention will become more apparent by reference to the following detailed description of the invention taken in conjunction with the accompanying drawings wherein;

FIG. 2A is a schematic plane view, and FIG. 2B a schematic cross section along the line A—A in FIG. 2A.

FIGS. 6A through 6C are schematic views to show the first application of the storage node electrode of the first embodiment of this invention in which FIG. 6A is a schematic plane view, FIG. 6B a cross section thereof along the line A—A in FIG. 6A, and FIG. 6C a cross section thereof along the line B—B in FIG. 6A.

FIG. 8A is a schematic plane view, FIG. 8B a schematic cross section along the line A—A in FIG. 8A, and FIG. 8C a cross section along the line B—B in FIG. 8A.

DETAILED DESCRIPTION OF THE PREFERRED EMBODIMENTS

Before explaining the embodiments of this invention, the DRAM having the prior art stacked capacitor for storing electric charges will be described.

Figure 1:
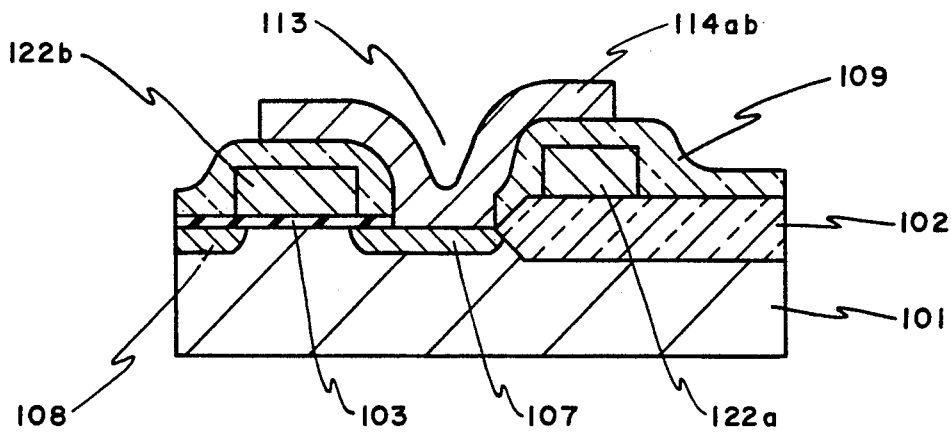
FIG. 1 is a schematic cross section to explain a prior art semiconductor memory device.

A typical stacked type DRAM will be explained referring to that disclosed in ISSCC DIGEST OF TECHNICAL PAPERS, pp. 250-251; Feb., 1985, which is shown in FIG. 1.

On the surface of a p-type silicon substrate 101 is selectively provided field oxide films 102 and active areas which are surrounded with the field oxide films 102. Gate insulation films 103 are provided on the surface of the active areas. In the memory cell array of a DRAM, there are provided plural word lines 122a, 122b which are substantially parallel to each other on the field oxide film 102 and the gate insulation film 103. The active area is provided with N+ type diffused layers 107, 108 which are self-matched with the word line 122b. The gate insulation film 103, the N+ type diffused layers 107, 108, and the word line 122b form a transistor for the memory cell array. The field oxide films 102, the gate insulation films 103, the word lines 122a and 122b are covered with the first insulation films between the layers 109. A node contact hole 113 which extends to the N+ diffused layer 107 is provided between the word line 122b on the gate insulation film 103 and the word line 122a on the field oxide film 102 adjacent to the film 103. The storage node electrode 114ab of the stacked type capacitor for charge storage is connected to the N+ diffused layer 107 via the node contact hole 113, extends over the word line 122b on the gate insulation film 103 via the first insulation film between layers 109, and at the same time extends over the word line 122a on the field oxide film 102 adjacent to the word line 122b via the first insulation film between layers 109.

Figure 2A:
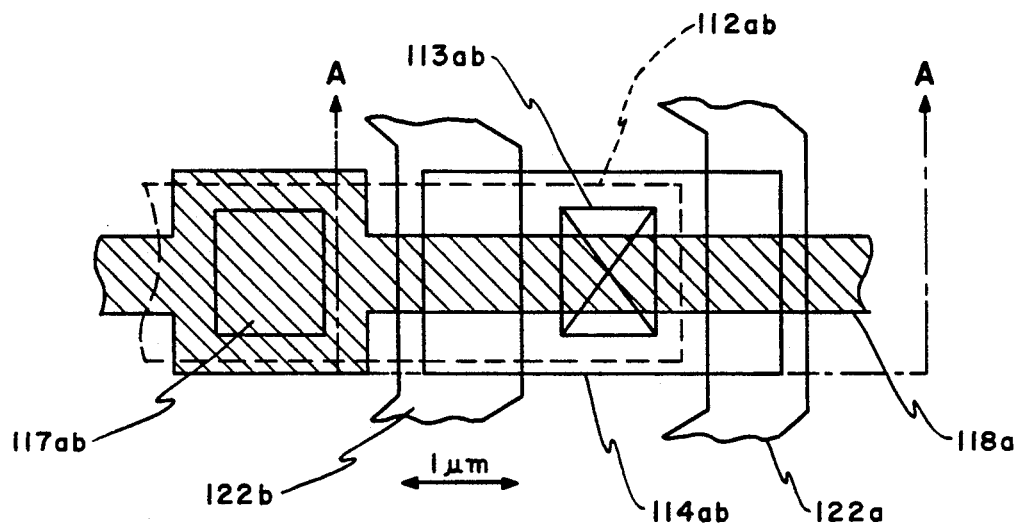
FIGS. 2A and 2B are schematic views to show the shape of the storage node electrode of the prior art semiconductor memory device based on the prior art semiconductor memory device.
Figure 2B:
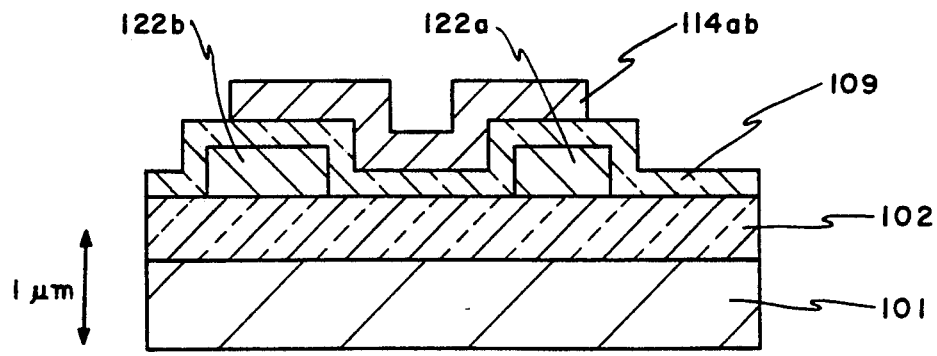

FIGS. 2A and 2B are the schematic views to explain the material and dimensions of an embodiment of this invention on the base of the prior art DRAM and schematically show the shape of the storage node electrode of the prior art DRAM in which FIG. 2A is a schematic plane view and FIG. 2B a schematic cross section along the line A—A of FIG. 2A. The prior art memory cells of the DRAM will be described in more detail by referring to the FIGS. 2A, 2B and 1.

On the surface of the p-type silicon substrate 101 is provided a field oxide film 102 by the selective oxidation method, and an active area 112ab surrounded with the field oxide film 102. Gate insulation films 103 are formed by thermal oxidation on the surface of the active area 112ab. The thickness of the field oxide film 102 is about 500 nm. The gate insulation film 103 is formed with a silicon oxide film of about 20 nm thickness. The word lines 122a, 122b are formed with an N+ type polycrystal silicon film of about 400 nm thickness. The width of the line (gate length) of the word line 122b on the active area 112ab (on the gate insulation film 103) is 1.0 μm, and that of the word line 122a on the field oxide film 102 is ca. 0.8 μm. The length of the word line 122b which crosses the active areas 112ab (gate width) is 1.4 μm. The N+ type diffused layers 107, 108 are formed by injection of As ions at energy of 70 kev and at dose of $5 \times 10^{15}$ cm$^{-2}$. The first insulation layer 109 is formed with a silicon oxide film of about 200 nm thickness by CVD method.

The storage node electrode 114ab is shaped by etching the N+ type polycrystal silicon film to have a side face vertical to the p-type silicon substrate 101 and a top face having a curved portion (including a flat portion). In order to estimate the surface area of the storage node electrode 114ab which has quite a complicated shape as shown in FIG. 2B, the surface is approximated to the shape comprising a plane which is vertical to the p-type silicon substrate and a plane which is parallel thereto. The side face is defined as formed by etching and the top face is defined as having been present before the etching process was carried out.

The surface of the storage node electrode 114ab is covered with a capacitance insulation film (not shown) which is formed with a silicon oxide film of the thickness of 15 nm by thermally oxidizing the storage node electrode 114ab. The surface of the capacitance insulation film is covered with a cell plate electrode (not shown) formed with a N+ polycrystal silicon film of about 300 nm thickness. The storage node electrode 114ab, the capacitance insulation film and the cell plate electrode form a stacked capacitor for storing electric charges. The surfaces of the stacked capacitor and of the first insulation film 109 are covered with second insulation films (not shown). The second insulation film is formed with a silicon oxide film of about 500 nm thickness made by CVD method. The bit contact hole 117ab which extends over the N+ type diffused layer 108 is formed by successively etching the second insulation film which is immediately above the diffused layer 108, the first insulation film 109, and the gate insulation film 103. The bit line 118a which intersects the word lines 122a and 122b in a substantially orthogonal relation is connected to the N+ type diffused layer 108 via the bit contact hole 117ab. The bit line 118a is formed with a tungsten silicide film of about 300 nm thickness. The bit line 118 is expressed with hatched lines from left to right in FIG. 2A.

Figure 3:
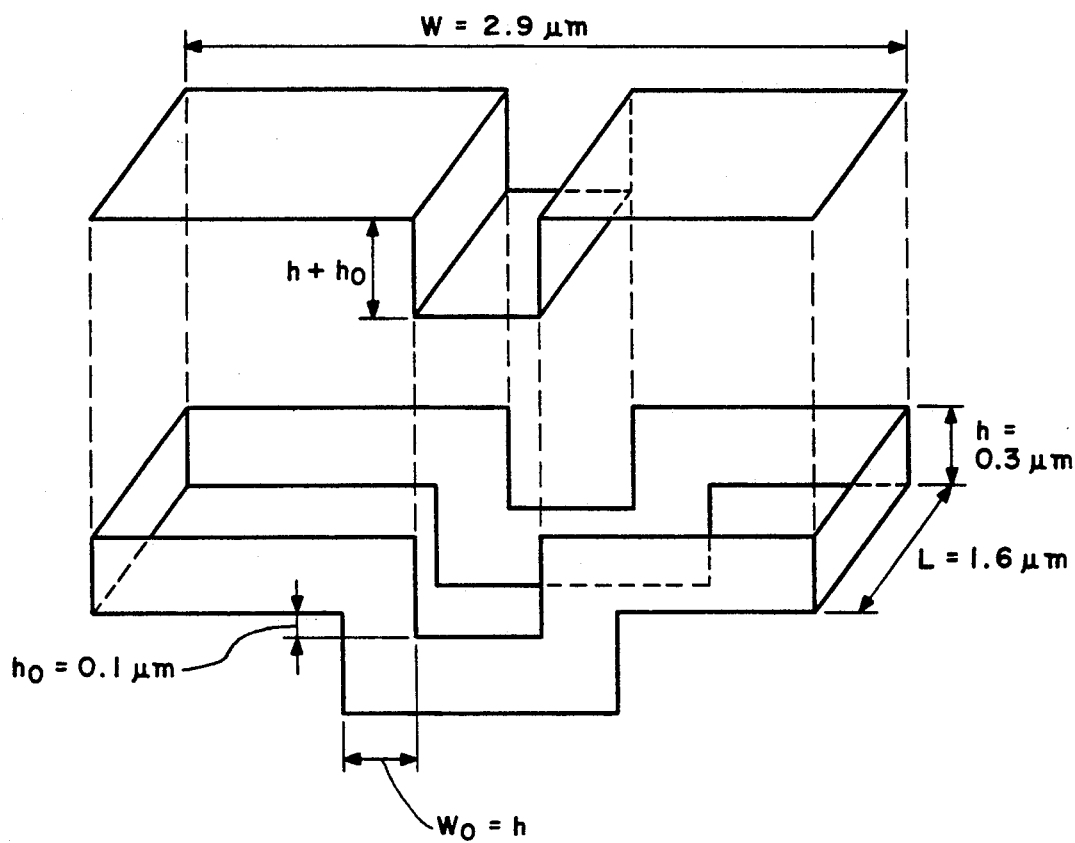
FIG. 3 is a schematic view to show the shape of the storage node electrode of the prior art semiconductor memory device and to estimate the surface area thereof.

As shown in FIG. 2B, when the shape of the storage node electrode 114ab is schematically shown, the shape of the top face and side face of the storage node electrode 114ab become as shown in FIG. 3. In the figure, the top face shape is shown in the upper portion, and that of the side face in the lower portion. The surface area $S_{ot}$ of the top face is calculated as below.

$$S_{ot} = L \times [W + 2(h + h_0)]$$
$$= 1.6 \times (2.9 + 0.8) \, \mu m^2$$
$$= 5.92 \, \mu m^2$$

The surface area of the side face $S_{OS}$ is calculated as below.

$$S_{os} = 2 \times h \times [W + L + 2(h + h_0)]$$
$$= 0.6 \times (2.9 + 1.6 + 0.8) \, \mu m^2$$
$$= 3.18 \, \mu m^2$$

Therefore, the surface area $S_0$ of the storage node electrode 114ab (or the opposing areas of the storage node electrode and the cell plate electrode of the capacitor for electric charge storage) is obtained as below.

$$S_o = S_{ot} + S_{os} = 9.10 \, \mu m^2.$$

This invention will now be described referring to attached drawings.

Figure 4:
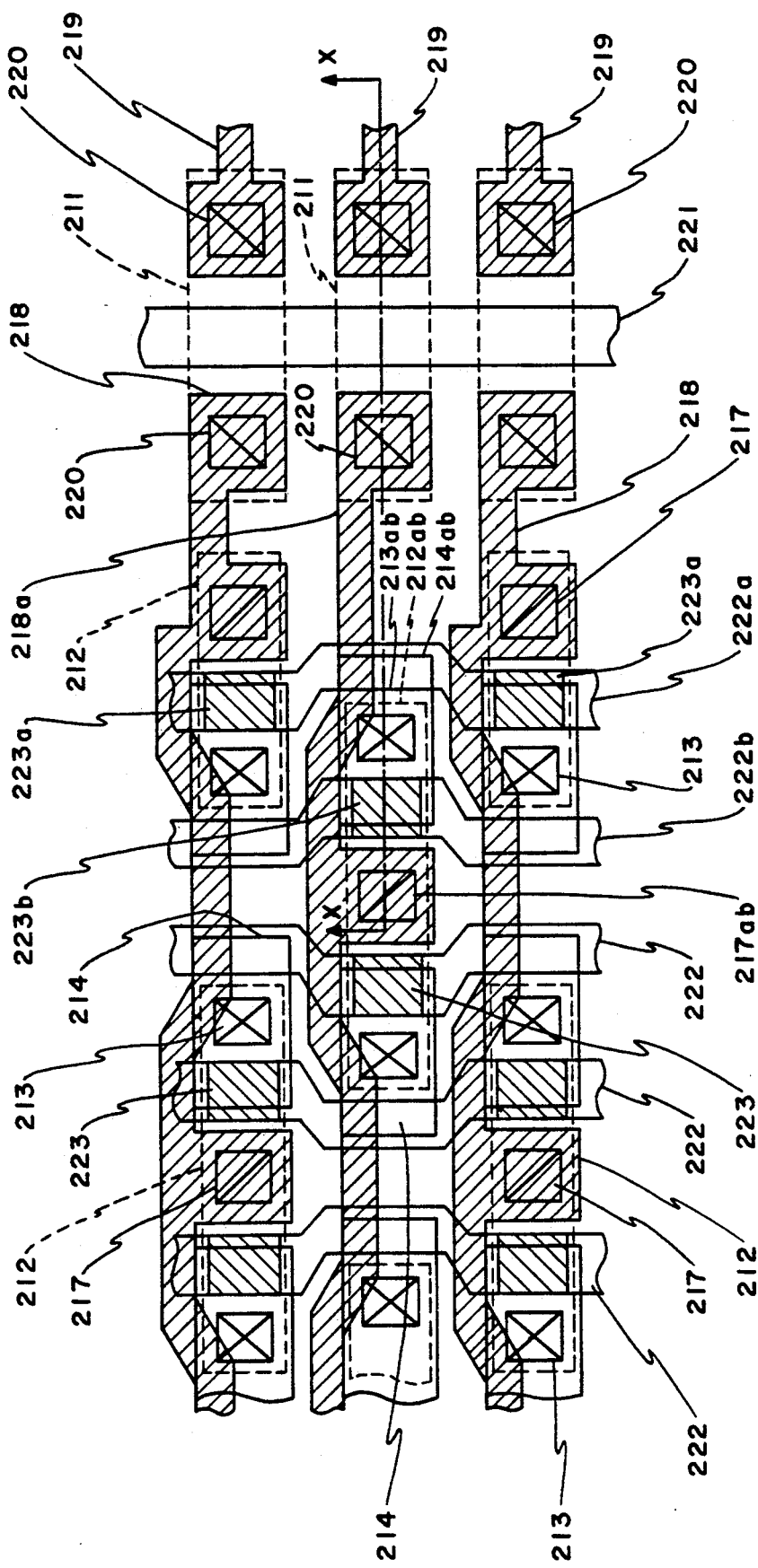
FIG. 4 is a schematic plane view to explain the first embodiment of this invention semiconductor memory device.
Figure 5A:
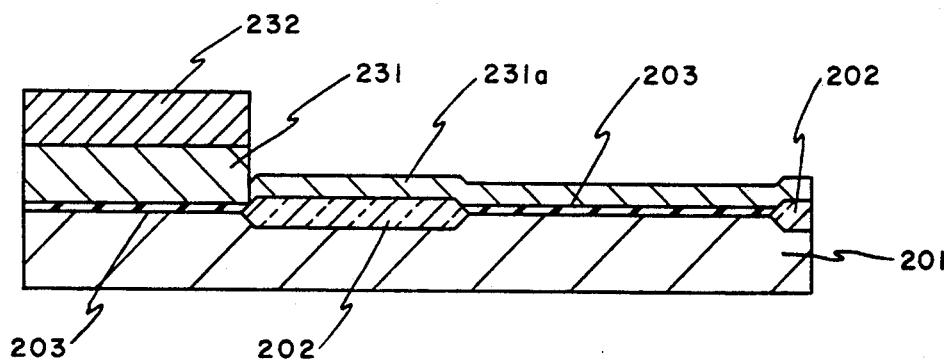
FIGS. 5A through 5C are cross sections of the semiconductor memory device shown in FIG. 4 to explain the flow of the processing steps in the manufacture of the first embodiment of this invention.
Figure 5B:
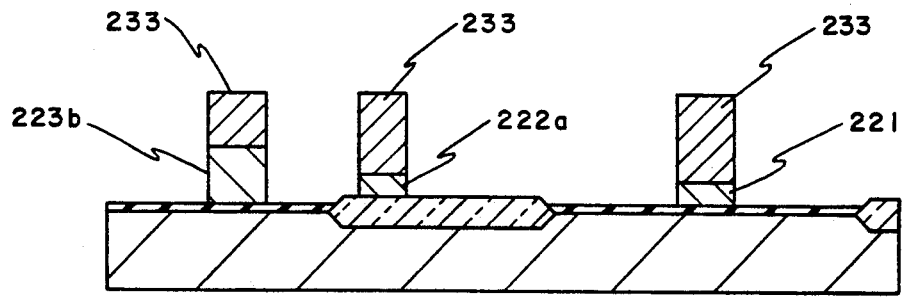
Figure 5C:
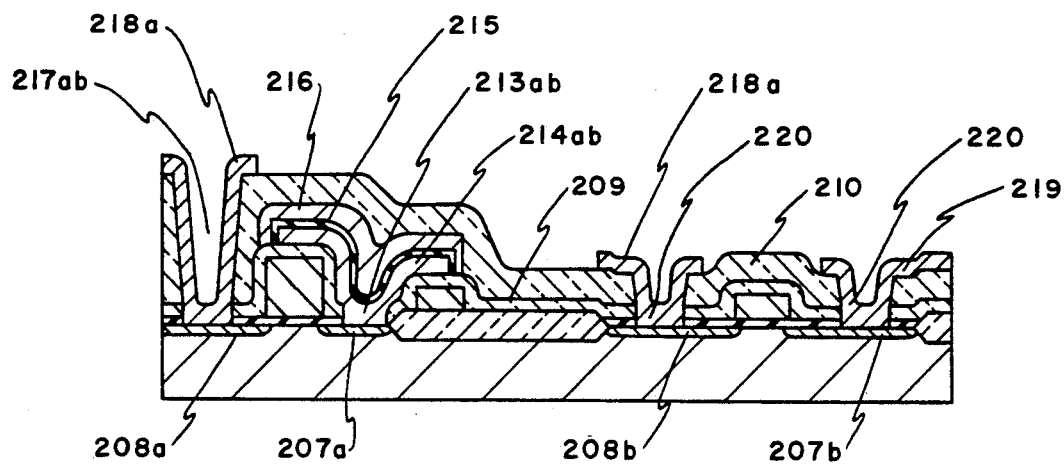
Figure 6A:
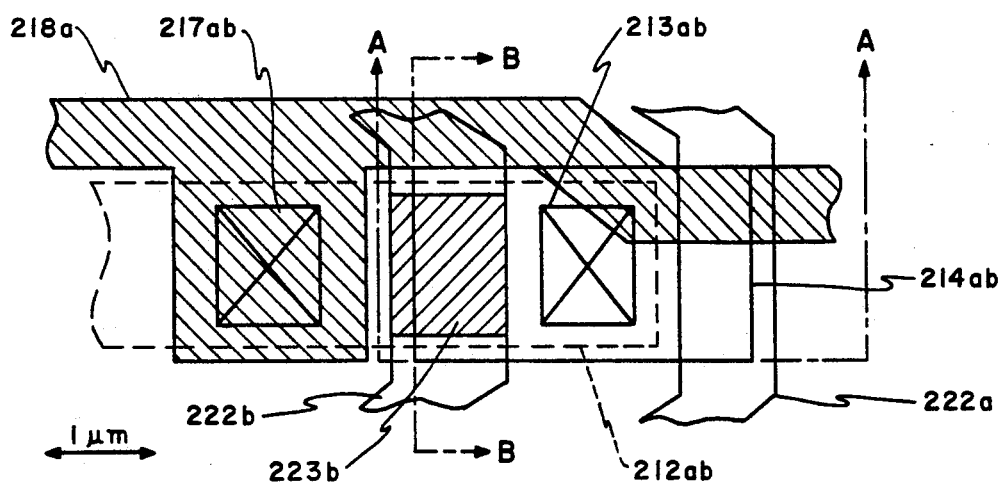
Figure 6B:
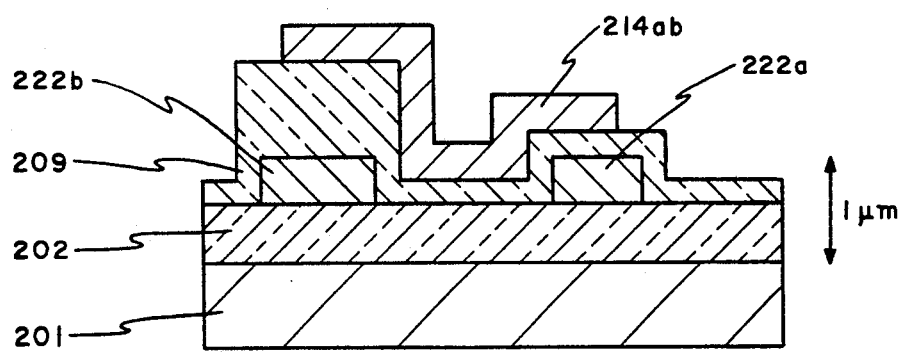
Figure 6C:
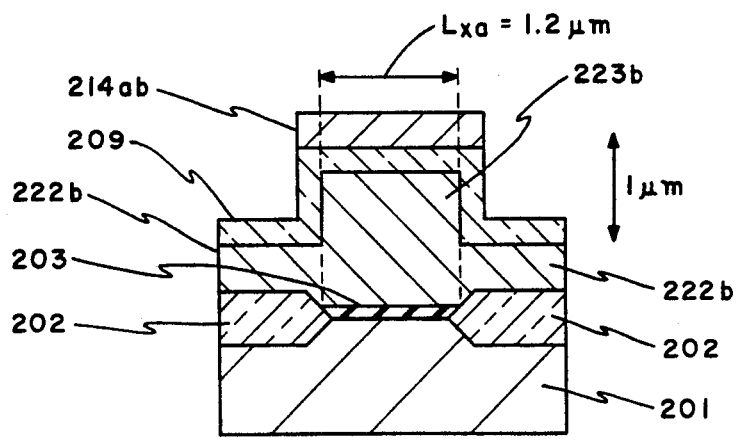
Figure 7:
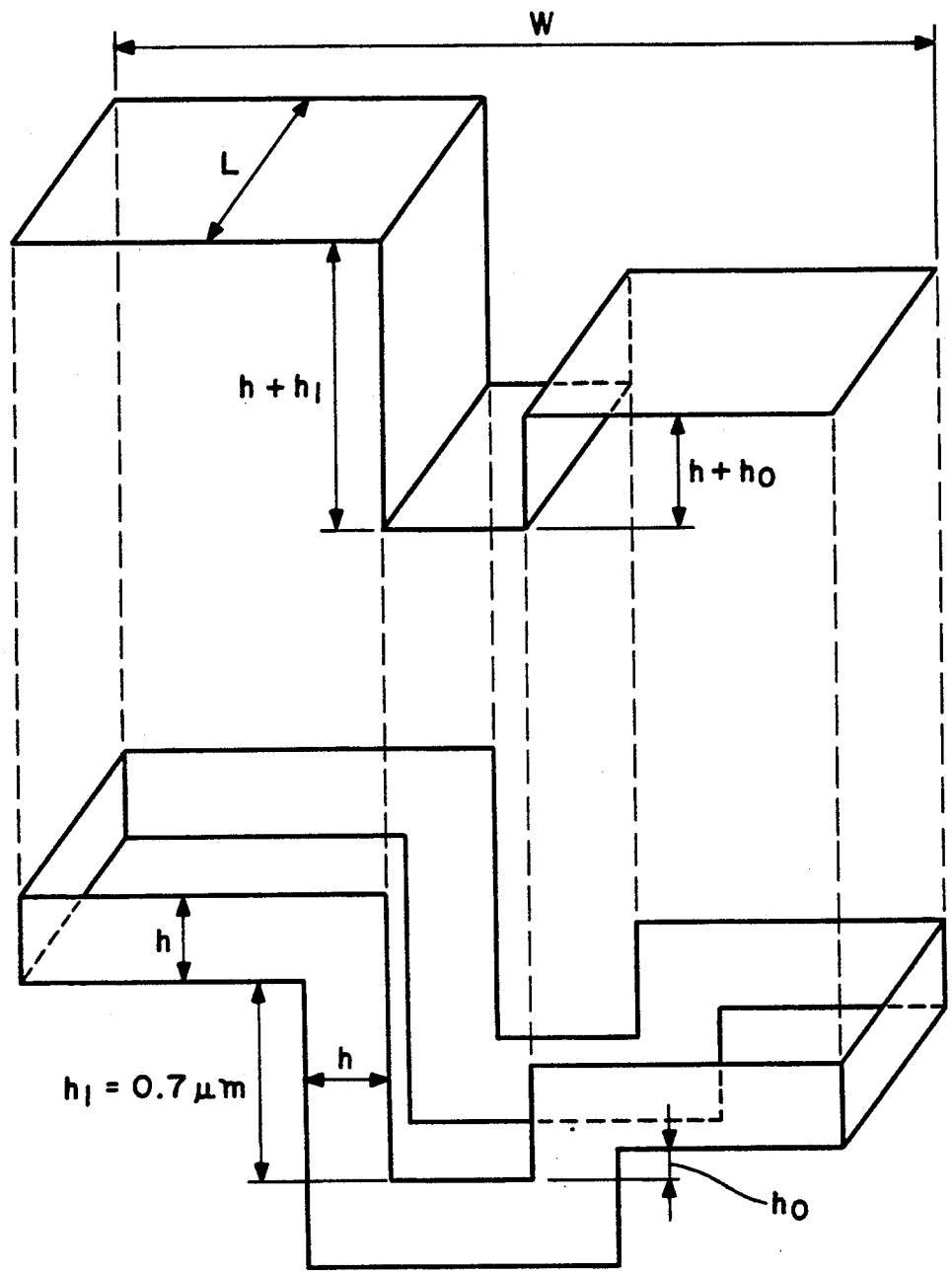
FIG. 7 is a schematic view to show the storage node electrode of the first embodiment of the semiconductor memory device of this invention and to estimate the surface area thereof.
Figure 8A:
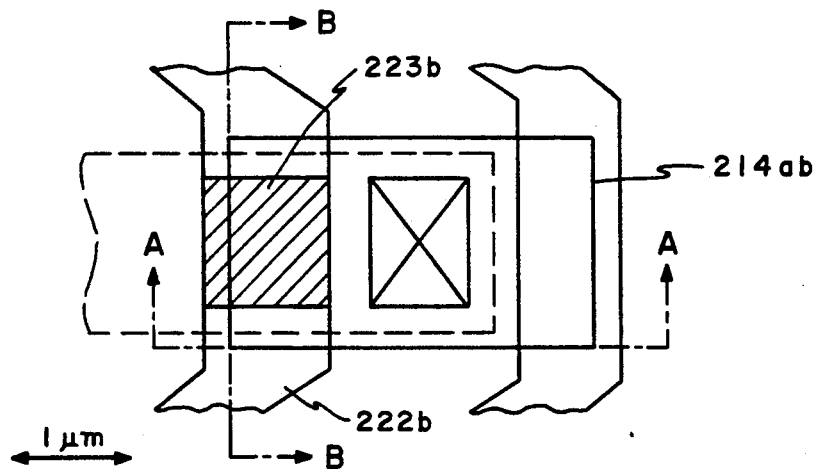
FIGS. 8A through 8C are schematic views to show the shape of the second application of the storage node electrode of the first embodiment semiconductor memory device of this invention.
Figure 8B:
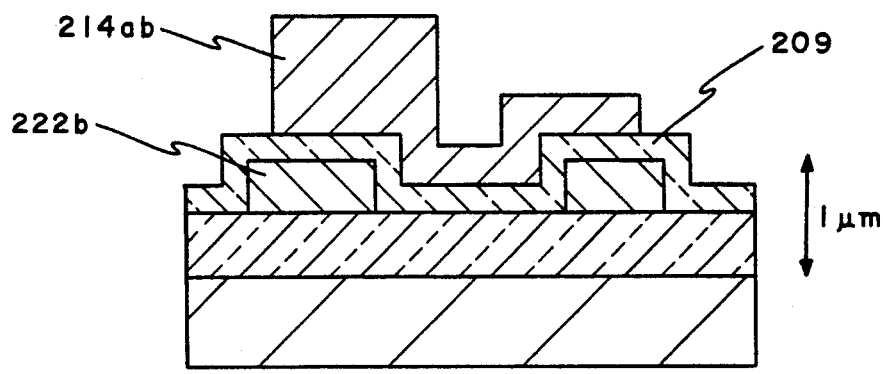
Figure 8C:
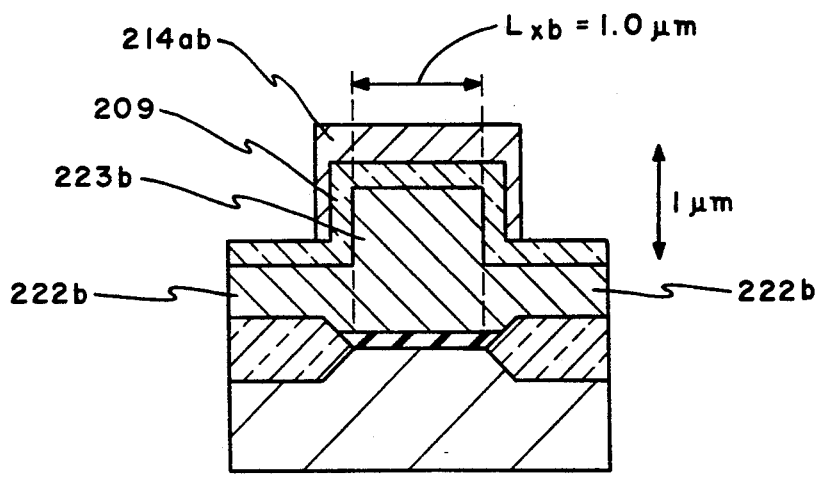
Figure 9:
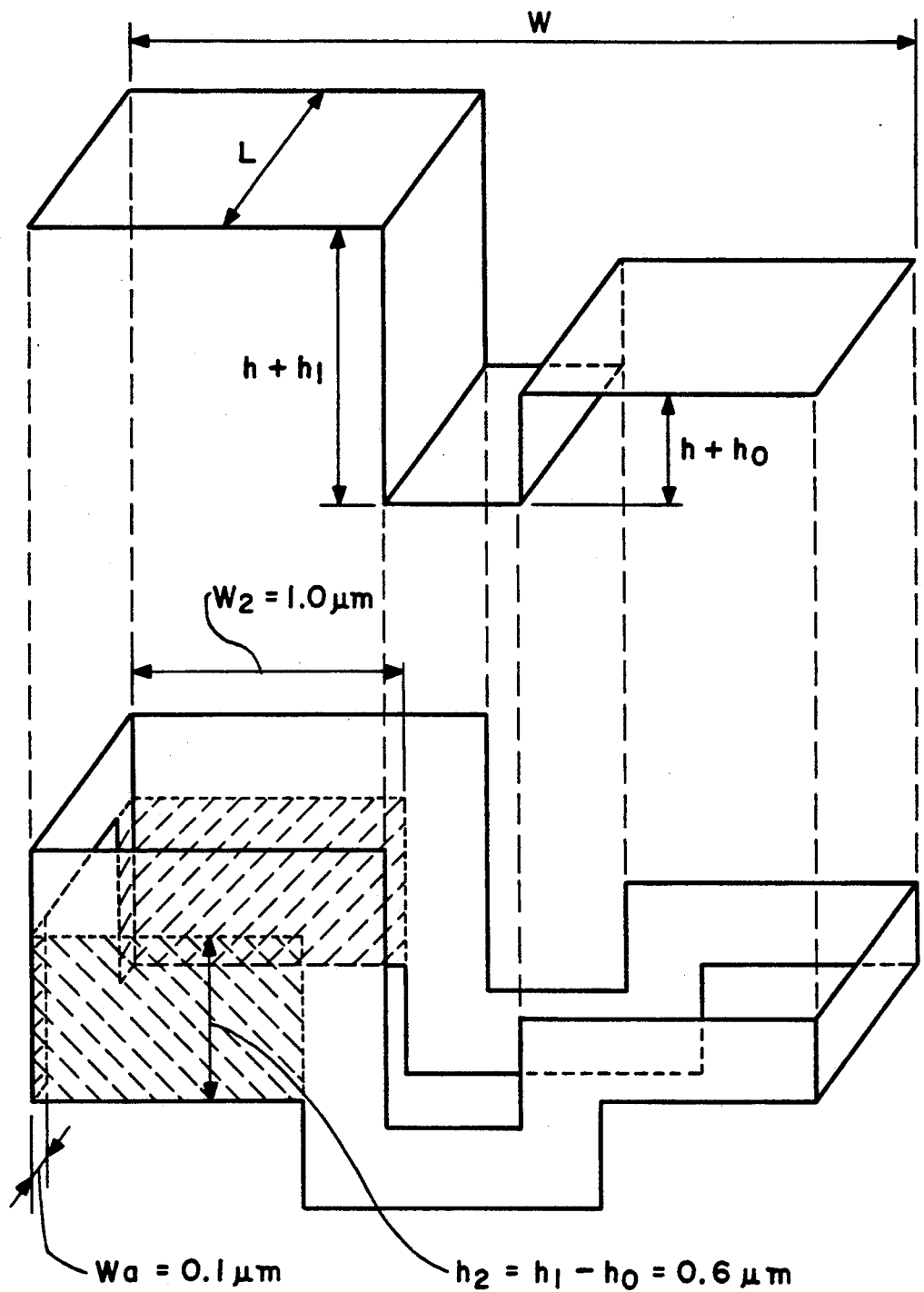
FIG. 9 is a schematic view to show the second application of the storage node electrode of the first embodiment semiconductor memory device of this invention and to estimate the surface area thereof.

FIG. 4 is a schematic view to explain the first embodiment of this invention. FIGS. 5A through 5C are the views to show the processing steps of the manufacturing method of the DRAM according to this embodiment, and the cross sectional views along the line X—X in FIG. 4. FIGS. 6A through 6C are schematic views to show the shape of the storage node electrode of the first application of the present embodiment; FIG. 6A is a schematic plane view, FIG. 6B a sectional view along the line A—A in FIG. 6A, and FIG. 6C a sectional view along the line B—B in FIG. 6A. FIG. 7 is a schematic view to show the shape of the storage node electrode of the first application of the present embodiment for estimation of the surface area. FIGS. 8A through 8C are the schematic views to show the shape of the second application of the storage node electrode of the present embodiment; FIG. 8A is a plane view, FIG. 8B a sectional view along the line A—A of FIG. 8A, and FIG. 8C a sectional view along the line B—B in FIG. 8A. FIG. 9 is a schematic view to show the shape of the second application of the storage node electrode of this embodiment for estimation of the surface area thereof.

The structure of the DRAM of this embodiment will now be described by referring to FIG. 4.

A p-type silicon substrate is selectively provided with the field oxide films on the surface thereof, and active areas 211, 212 and 212ab are formed surrounded by the field oxide films on the surface of the silicon substrate. Gate insulation films are formed on the surface of the active areas 211, 212, 212ab. Substantially parallel plural word lines 221, 222a, 222b are formed on the field oxide films at the memory cell array of the DRAM. The word lines 223 and 223b are provided on at least a part of the active areas 212 and 212ab, and the word line 223a is provided on at least a part of the active area 212. The word lines 222 and 222b are connected to the word lines 223 and 223b of a larger film thickness on the active areas 212 and 212ab. The word line 222a is connected to the word line 213a on the active area 212. Gate electrodes 221 are provided on the field oxide film and the active area 211 in the peripheral circuitry. The film thickness of the word lines 222, 222a and 222b is identical to the film thickness of the gate electrode 221. The word lines with thicker films are expressed with hatched lines from right to left in FIG. 4.

The active areas 212 and 212ab are provided with an N+ type diffused layer which is self-matched to the word lines. The N+ type diffused layer, the gate insulation film and the word lines form a transistor on the memory cells. The active area 211 is provided with an N+ type diffused layer in a self-matching manner to the gate electrode 221. The N+ diffused layer, the gate insulation layer and the gate electrode 221 form a transistor of the peripheral circuitry.

The surfaces of the field oxide film, the active areas 211, 212, 212ab, the gate electrode 211, and the word lines 222, 222a, 222b, 223, 223a and 223b are covered with the first insulation film between layers. Between a word line which exists on a field oxide film and an adjacent word line which exists on an active area are provided node contact holes 213, 213ab which extend to reach the N+ type diffused layer. The storage node electrodes 214, 214ab are connected to the N+ type diffused layer via the node contact holes 213, 213ab. The storage node electrodes extend over the two word lines across the first insulation film, with the two word lines being on both sides of the N+ diffused layer to which the electrodes are connected. For instance, the storage node electrode 214ab is connected to an N+ type diffused layer via the node contact hole 213ab and extends over the word lines 222a and 223b (including a part of the word line 222b) via the first insulation film. The surfaces of the storages of the storage node electrodes 214, 214ab are covered with the capacitance insulation films which in turn are covered with cell plate electrodes. The storage node electrodes, the capacitance insulation film and the cell plate electrodes form a stacked capacitor for storing electric charges according to this embodiment.

The embodiment will later be described with specific numeric figures. As the storage node electrodes extend over the word lines having a thicker film in this embodiment, it can have a larger surface area than the prior art storage node electrode, and has a larger capacitance of the stacked capacitor than the prior art.

The surfaces of the stacked capacitor for electric charge storage and of the first insulation film between layers are covered with the second insulation film between layers. The bit contact holes 212, 212ab are formed on the word lines 223, 223a, 223b to reach the N+ type diffused layer which is on the other side of or not adjacent to the word lines of the field oxide films. For instance, in the active area 212ab, the bit contact hole 217ab is provided between the word line 223 and the word line 223b. A contact hole 220 is formed for the N+ type diffused layer in the active area 211 of the peripheral circuitry. Bit lines 218, 218a and the metal wiring 219 are provided on the second insulation film. The bit line 218 is connected to the N+ type diffused layers of the active areas 212 and 211 via the bit contact hole 217 and the contact hole 220. The bit line 218a is connected to the N+ type diffused layers of the active areas 212, 212ab and of the active area 211 via the bit contact holes 217, 217ab and the contact hole 220. The bit lines 218, 218a intersect the word lines via the second insulation film in a substantial orthogonal manner. Intersection takes place at locations other than the word lines of a larger film thickness (or the word lines 223, 223a, 223b). In FIG. 4, the bit lines and the electrode wirings are shown with hatched lines from left to right.

This embodiment is advantageous in that the bit lines are less likely to be broken as the intersection of the word lines with the bit lines avoiding the thick film word lines.

The manufacturing method of the DRAM of this embodiment will now be described by referring to FIGS. 4 and 5A through 5C. A p-type silicon substrate 201 is formed with a field oxide film 202 of about 500 nm thickness on the surface thereof by selective oxidization. This forms active areas 211, 212ab, 212 on the surface of the substrate 201. Gate insulation films 203 are formed with silicon oxides film of about 20 nm thickness by thermal oxidization on the surfaces of the active areas 211, 212ab and 212. A polycrystal silicon film 231 of N+ type is formed over the surface to have the film thickness of about 1000 nm in order to provide a photoresist film 232 which covers at least part of the active areas 212ab and 212. By etching the polycrystal silicon film 231 using the photoresist film 232 as a mask, the polycrystal silicon film 231a of N+ type is formed to have the thickness of about 400 nm [FIGS. 5A and 4].

After removing the photoresist film 232, a photoresist film 233 is formed. By etching the polycrystal silicon films 231, 231a using the photoresist film 233 as a mask, the word lines 222a, 223b (and the word lines 222, 222b, 223, 223a) and the gate electrode 221 are formed. The film thickness of the word line 223b (and of the word lines 223, 223a) is 1000 nm, which is larger than the film thickness of the word line 222a (and of the word lines 222, 222b) and of the gate electrode 221 by about 600 nm. The line width (gate length) of the word lines 222b, 223b (and the word lines 222, 222a, 223, 223a) on the active areas 212ab, 212 and of the gate electrode 221 on the active area 211 (or on the gate insulation film 203) is 1.0 μm, the line width of the word lines 222, 222a and 222b on the field oxide film 202 is about 0.8 um, and the line width of the gate electrode 221 on the field oxide film 202 is about 1.0 μm. The length of the word lines and the gate electrode 221 across the active areas (gate width) is 1.4 μm [FIGS. 5B and 4].

After removing the photoresist film 233, N+ type diffused layers 207a, 207b, 208a and 208b are formed by injecting As ions at the energy of 70 keV and at the dose of $5 \times 10^{15}$ cm$^{-2}$. By using the CVD method, the first insulation film 109 is formed with a silicon oxide film of about 200 nm thickness all over the surface. The first insulation film 209 which is immediately on the N+ diffused layer 207a and the gate insulation film 203 are sequentially etched to form a node contact hole 213ab (and a node contact hole 213). An N+ type polycrystal silicon film is deposited all over the surface at the thickness of about 300 nm, which is patterned to form a storage node electrode 214ab (and a storage node electrode 214). The surface of the storage node electrode 214ab (and of the storage node electrode 214) is thermally oxidized to form a capacitance insulation film 215 with a silicon oxide film of the thickness of about 15 nm. An N+ polycrystal silicon film is deposited over the whole surface to the film thickness of about 300 nm, which in turn is patterned to form a cell plate electrode 216. Then, a second insulation film 210 is formed by the CVD method with a silicon oxide film all over the surface to have about 500 nm thickness. The second insulation film 210 which is immediately above the layer 208, the first insulation film 209, and the gate insulation film 203 are sequentially etched to form a bit contact hole 217ab (and a bit contact hole 217). Simultaneously, the second insulation film 210 which is immediately above the N+ diffused layers 207b, 208b, the first insulation film 209 and the gate insulation film 203 are sequentially etched to form a contact hole 220. Tungsten silicide film is deposited over the whole surface at the thickness of about 300 nm, which is then patterned to form a bit line 218a (and a bit line 218) and the metal wiring 218 [FIGS. 5C and 4].

By adding one extra step of an ordinary etching, this embodiment can increase the surface area of the storage node electrode successfully. This can realize an increase of the surface area of the storage node electrode without applying an extra burden in processing the storage node electrodes.

Referring to FIGS. 6A through 6C and 7, the surface area of the storage node electrode in the first application of this embodiment will be estimated.

In the first application, the interval between the word line of a thicker film 223b and the field oxide film 202 is 0.1 μm and the length of the word line 223b (L×a) is 1.2 μm. Similar to approximation made on the prior art DRAM's storage node electrode, the surface of the storage node electrode 214ab is approximated to a plane which is vertical to the p-silicon substrate 201 and another plane which is parallel thereto [FIG. 6A through 6C].

FIG. 7 shows the shape of the top and the side faces of the storage node electrode 214ab. In the figure, the shape of the top face is shown in the upper portion while that of the side face is shown in the lower portion. The surface area of the top face $S_{1-1t}$ is calculated as below.

$$S_{1-1t} = L \times [W + (h + h_0) + (h + h_1)]$$
$$= 1.6 \times (2.9 + 0.4 + 1.0) \, \mu m^2$$
$$= 6.88 \, \mu m^2$$

The surface area $S_{1-1s}$ of the side face is calculated as below.

$$S_{1-1s} = 2h \times [L + W + (h + h_0) + (h + h_1)]$$
$$= 0.6 \times (1.6 + 2.9 + 0.4 + 1.0) \, \mu m^2$$
$$= 3.54 \, \mu m^2$$

Therefore, the surface area $S_{1-1}$ of the storage node electrode 214ab (or the opposing areas of the storage node electrode and the cell plate electrode of the capacitor for storing electric charges) will be obtained by the formula below.

$$S_{1-1} = S_{1-1t} + S_{1-1s} = 10.42 \, \mu m^2$$

As a result, the surface area of the storage node electrode of the first application of the embodiment increases from the prior art by 15%.

Referring now to FIGS. 8A through 8C and 9, the surface area of the storage node electrode in the second application of this embodiment will be estimated.

In the second application, the interval between the word line of the thicker film 223b and the field oxide film 202 is 0.2 μm, and the length L×b of the word line 223b is 1.0 μm. Similar to the approximation made on the prior art DRAM's storage node electrode, the surface of the storage node electrode 214ab is approximated to comprise a plane which is vertical to the p-type silicon substrate 201 and another plane which is parallel to the substrate [FIGS. 8A through 8C].

The shapes of the top and side faces of the storage node electrode 214ab become as shown in FIG. 9. The shape of the top face is shown at the upper portion of the figure and that of the side face at the lower portion thereof. The surface area of the top face $S_{1-2t}$ is identical to $S_{1-1t}$. The surface area of the side face $S_{1-2t}$ is larger than $S_{1-1t}$ by the portion hatched in the figure.

$$S_{1-2s} = S_{1-1s} + 2h \times (W_a + W_2)$$

Therefore, the surface area $S_{1-2}$ of the storage node electrode 214ab (or the opposing areas of the storage node electrode and the cell plate electrode of the capacitor for storing electric charges) will be obtained as below.

$$\begin{aligned} S_{1-2} &= S_{1-1} + 2h \times (W_a + W_2) \\ &= 10.42 \, \mu m^2 + 1.32 \, \mu m^2 \\ &= 11.74 \, \mu m^2 \end{aligned}$$

As a result, in the second application, the surface area of the storage node electrode increases by 29% from the prior art.

In this embodiment, the surface area of the storage node electrode becomes maximum when the interval between the word line 223b and the field oxide film 202 is 0.35 μm and the length of the word line 223b Lx (max) is 0.7 μm. In this case, the surface area $S_1$ (max) of the storage node electrode is 11.98 μm² which is an increase by 32% from the prior art.

Figure 10:
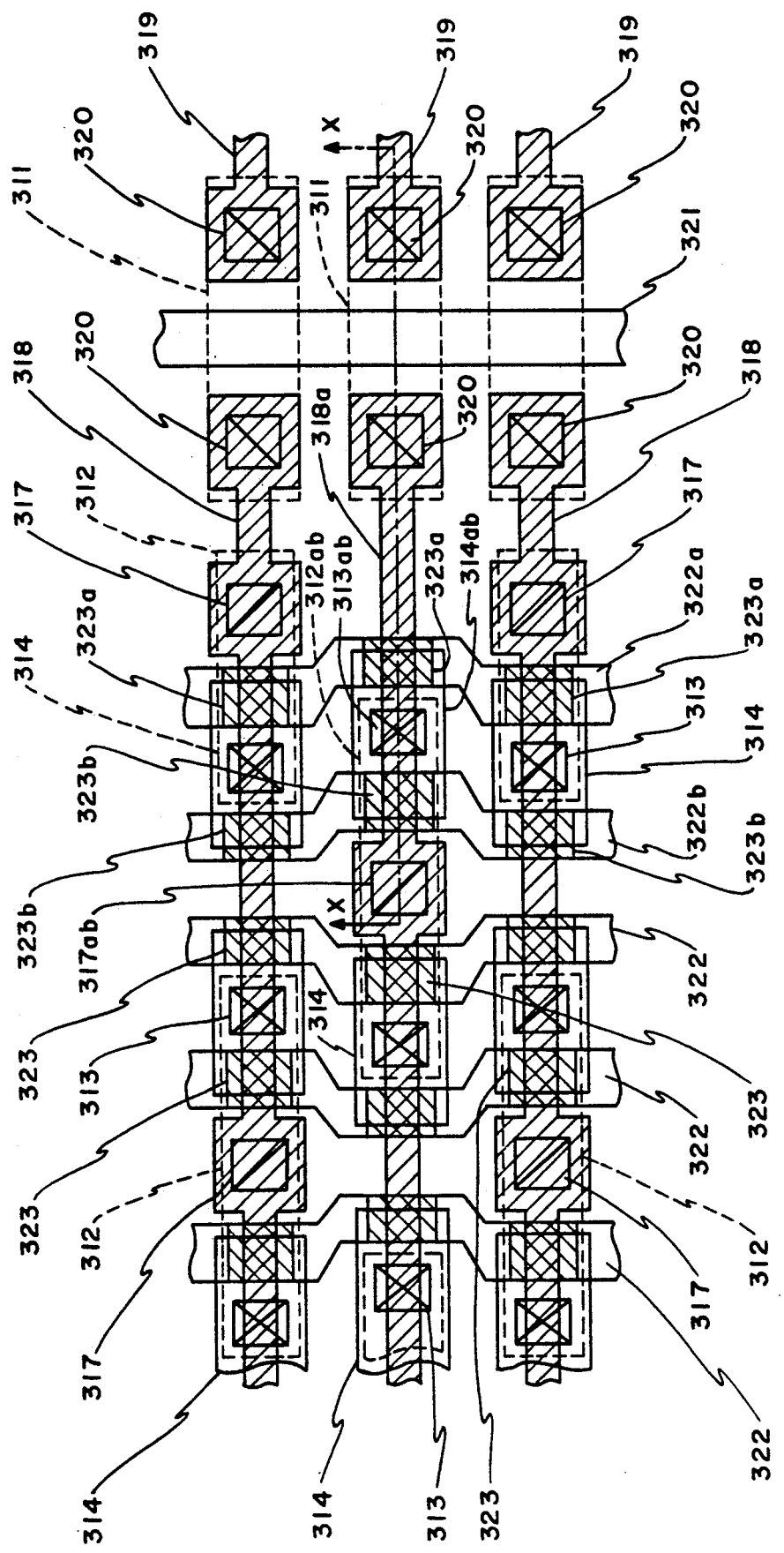
FIG. 10 is a schematic view to explain the second embodiment of the semiconductor memory device of this invention.
Figure 11A:
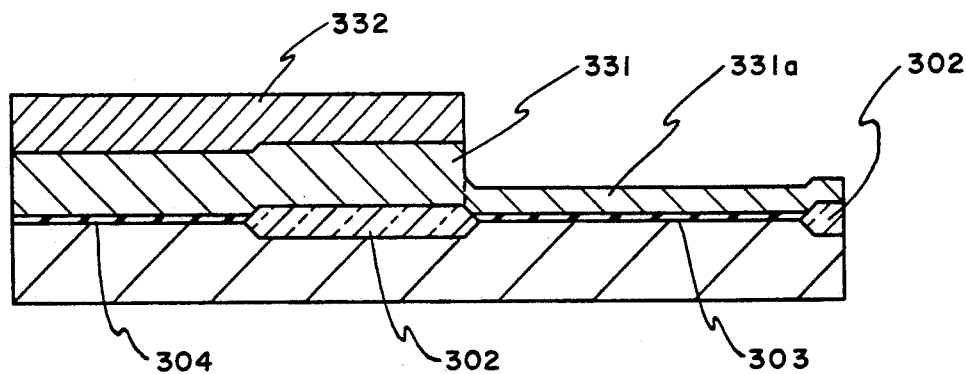
FIGS. 11A through 11C are the cross sectional views along the line X—X in FIG. 10 to show the flow of the processing steps in the manufacture of the second embodiment semiconductor memory device of this invention.
Figure 11B:
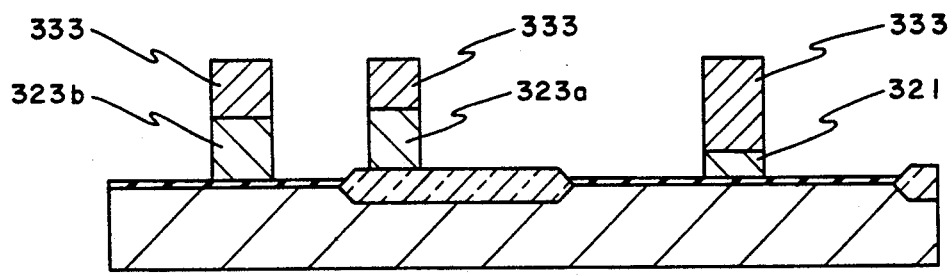
Figure 11C:
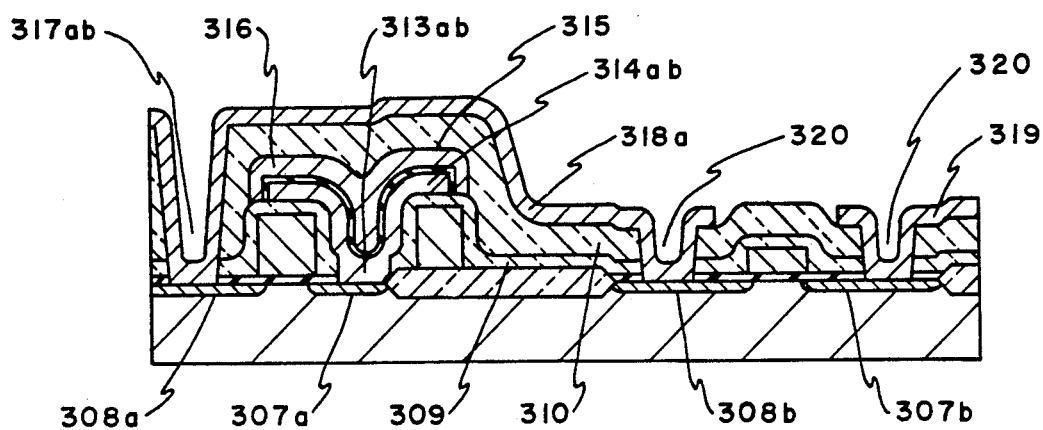
Figure 12:
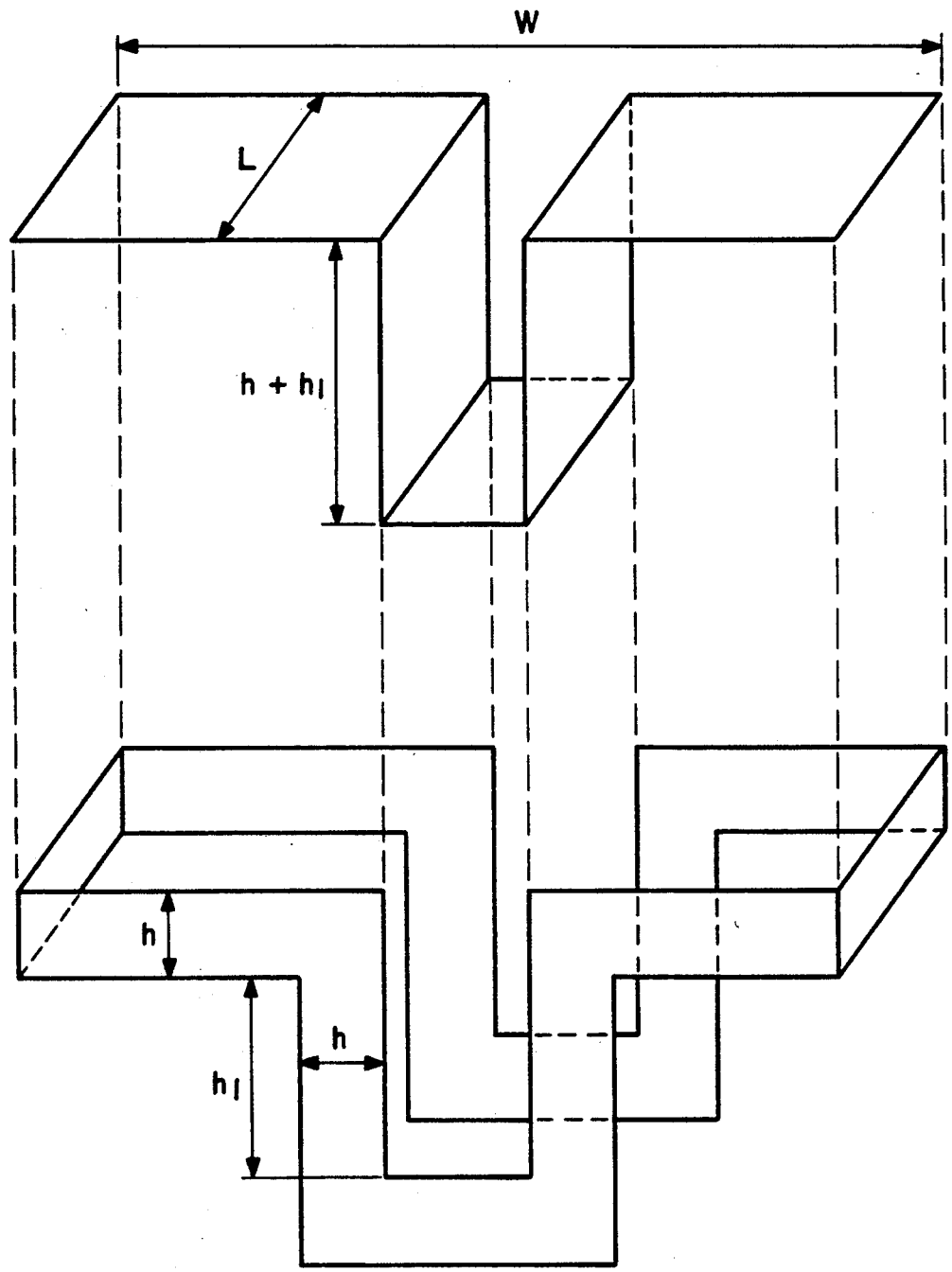
FIG. 12 is a schematic view to show the shape of the storage node electrode of the second embodiment of this invention and to estimate the surface area thereof.

FIG. 10 is a schematic plane view to explain the second embodiment of this invention. FIGS. 11A through 11C are cross sections cut along the line X—X of FIG. 10 to explain the manufacture method of the DRAM relating to this embodiment. FIG. 12 is a schematic view to show an application of a storage node electrode of this embodiment for estimation of the surface area thereof.

Referring now to FIG. 10, the structure of the DRAM of this embodiment will be described.

A p-type silicon substrate is selectively provided with field oxide films on the surface thereof and active areas 311, 312, 312a are formed surrounded by the field oxide films. Gate insulation films are formed on the surfaces of the active areas 311, 312, 312ab. In the memory cells of the DRAM, the word lines 322 and 323, 322a and 323a, and 322b and 323b which are substantially parallel to each other in each pair are formed. The word line 322 is connected to the word line 323, the word lines 322a to the word line 323a, and the word line 322b to the word line 323b. The film thickness of the word lines 323, 323a, and 323b is larger than that of the word lines 322, 322a, and 322b. The word lines 322 and 322b are provided on the field oxide film and the active areas 312 and 312ab. The word line 322a is provided on the field oxide film and the active area 312. The word lines 323 and 323b are provided over at least a part of the active areas 312 and 312ab, and over at least a part of the field oxide films in the void in the active areas connected to the same bit line. The word line 323a is provided over at least a part of the active area 312 and over at least a part of the field oxide film in the void in the active area connected to the same bit line. In the peripheral circuitry, a gate electrode 321 is provided on the field oxide film and active areas 311. The film thickness of the word lines 322, 322a and 322b is identical to that of the gate electrode 311.

An N+ type diffused layer is provided on the active areas 312 and 312ab in a manner self-matching to the word lines. The N+ type diffused layer, the gate insulation film and the word lines form a transistor for the memory cell array. The active area 311 is provided with an N+ type diffused layer in a manner self-matching with the gate electrode 321. The N+ type diffused layer, the gate insulation film and the gate electrode 321 form a transistor of the peripheral circuitry.

The field oxide film, the active areas 311, 312, 312ab, the gate electrode 311, and the word lines 322, 322a, 322b, 323, 323a, and 323b are covered with the first insulation film on the surfaces thereof. Node contact holes 313, 313b are formed to reach the N+ type diffused layer between adjacent word lines one of which is present on a field oxide film and the other of which is present on an active area. The storage node electrodes 314, 314ab are connected to the N+ type diffused layer via the node contact holes 313 and 313ab. The storage node electrodes extend over the word lines on both sides of the N+ diffused layer to which the storage node electrodes are connected via the first insulation film. For instance, the storage node electrode 314ab is connected to an N+ type diffused layer via the node contact hole 313ab and extends over the word lines 323a, 323b (including a part of the word lines 322a and 322b) via the first insulation film. The surface of the storage node electrode 314 and 314ab are covered by capacitance insulation film which in turn is covered with cell plate electrodes. These storage node electrodes, capacitance insulation film, and cell plate electrodes form a stacked type capacitor for storing electric charges of this embodiment.

Unlike the first embodiment where one side of the storage node electrode extends over the word line with a thicker film, the storage node electrode of this embodiment extends on both sides thereof over the word lines with a thicker film. This results in the surface area of the storage node electrode which is larger than that in the first embodiment.

The surfaces of the stacked capacitor for storing electric charges and of the first insulation film are covered with the second insulation film. The word lines on active areas are provided with bit contact holes 317 and 318 which extend to the N+ type diffused layer on the side not adjacent to the word line on the field oxide film. For example, a bit contact hole 317ab is provided between the word lines 323 and 323b on the active area 312ab. In the peripheral circuitry, a contact hole 320 is provided for the N+ type diffused layer in the active area 311. The second insulation film between layers is provided with bit lines 318, 318a and a metal wiring 319. The bit line 318 is connected to the N+ type diffused layers of the active areas 312 and 311 via the bit contact hole 317 and the contact hole 320. The bit line 318a is connected to the N+ type diffused layers of the active areas 312, 312ab and 311 via the bit contact holes 317, 317ab and the contact hole 320. The bit lines 318, 318a and the word lines are intersecting each other substantially orthogonally via the first and second insulation films.

The manufacture method of the DRAM of this embodiment will not be described referring to FIGS. 10, 11A through 11C.

The surface of a p-type silicon substrate 301 is formed with a field oxide film 302 of the thickness of about 500 nm by selective oxidization. This forms active areas 311, 312ab and 312 on the surface of the p-type silicon substrate 301. The surface of the active areas 311, 312ab, and 312 are formed with a gate insulation film 303 of silicon oxide film of about 20 nm thickness and with a gate insulation film 304 of silicon oxide film of the thickness of about 40 nm by thermal oxidization. An N+ type polycrystal silicon film 231 is formed all over the surface of about 1000 nm thickness, and a photoresist film 332 is formed to cover at least a part of the active areas 312ab and 312 and at least a part of the field oxide film 302 existing in the void of the active areas connected to the same bit lines. Using the photoresist film 332 as a mask, the polycrystal silicon film 331 is etched to form a polycrystal silicon film 331a of N+ type of about 400 nm thickness. By this processing step, a polycrystal silicon film 331a can be formed even in the void in the active areas connected to different bit lines [FIGS. 10, 11A].

In this embodiment, by setting the film thickness of the gate insulation film 304 of the memory cell array at a level larger than that of the gate insulation film 303 of the peripheral circuitry, the resistance against the voltage applied on the word lines by the word bootstrap circuit (2-4 volts higher than the peripheral circuits) can be increased from that in the first embodiment.

A photoresist film 333 is formed after removal of the photoresist film 332. The word lines 323a, 323b (and the word lines 322, 322a, 322b and 323) and the gate electrode 321 are formed by using the photoresist film 333 as a mask and etching the polycrystal silicon films 331 and 333a. The film thickness of the word lines 323a and 323b (and the word line 323) is larger than that of the word lines 322a, 323a and 322b and that of the gate electrode 321 by about 600 nm. The line width (the gate length) of the word lines 322a, 323a, 322b and 323b (and the word lines 322 and 323) on the active areas 312ab and 312 (on the gate insulation film 304) and the line width (the gate length) of the gate electrode 321 on the active area 311 (on the gate insulation film 303) is 1.0 um, the line width of the word lines 322, 323, 322a, 322b and 323b on the fixed oxide film 302 is about 0.8 μm, and the line width of the gate electrode 321 on the field oxide film 302 is about 1.0 μm. The length of the word lines and the gate electrode 321 which cross over the active areas (or the gate width) is 1.4 μm [FIGS. 11B and 10].

After removing the photoresist film 333, N+ type diffused layers 307a, 307b, 308a and 308b are formed by As ion injection at the energy of 70 keV and the dose $5 \times 10^{15}$ cm$^{-2}$. By means of CVD method, the first insulation film 309 is formed with silicon oxide film all over the surface at the thickness of about 200 nm. The first insulation film 309 immediately above the N+ type diffused layer 307a and the gate insulation film 304 are sequentially etched to form a node contact hole 313ab (and a node contact hole 313). N+ type polycrystal silicon film is deposited over the whole surface at the thickness of about 300 nm, which is then patterned to form a storage node electrode 314ab (and a storage node electrode 314). Then, a storage node electrode 314ab (and storage node electrode 314) is thermally oxidized on the surface thereof to form a capacitance insulation film 315 with a silicon oxide film of the thickness of about 15 nm. An N+ type diffused layer of polycrystal silicon film is deposited on the whole surface at the thickness of about 300 nm, which is then patterned to form a cell plate electrode 316. By means of CVD method, the second insulation film 310 is formed with a silicon oxide film of about 500 nm thickness. The second insulation film 310 which is immediately above the N+ type diffused layer 308a and the first insulation film 309 are sequentially etched to form a bit contact hole 317ab (and a bit contact hole 317). At the same time, the second insulation film 310 which are immediately above the N+ diffused layers 307b and 308b, the first insulation film 309 and the gate insulation film 303 are sequentially etched to form a contact hole 320. Tungsten silicide film is deposited on the whole surface with the thickness of about 300 nm, which is patterned to form a bit line 318a (and a bit line 318) and a metal wiring 319 [FIGS. 11C and 10].

Description will now be made on an application of this embodiment. When the interval between the word line 323b and the field oxide film 302 is 0.1 μm and the length of the word lines 323a and 323b is 1.2 μm, the shapes of the top face and the side face of the storage node electrode 314 is approximated as shown in FIG. 12. In this embodiment, the surface area becomes minimum. The surface area $S_{2t}$ of the top face is calculated as below.

$$S_{2t} = L \times (W + 2(h + h_1))$$
$$= 1.6 \times (2.9 + 2.0) \, \mu m^2$$
$$= 7.84 \, \mu m^2$$

The surface area $S_{2s}$ of the side face is calculated as below.

$$S_{2s} = 2h \times (L + W + 2(h + h_1))$$
$$= 0.6 \times (1.6 + 2.9 + 2.0) \, \mu m^2$$
$$= 3.60 \, \mu m^2$$

Therefore, the surface area $S_2$ of the storage node electrode 314ab is obtained as below.

$$S_2 = S_{2t} + S_{2s} = 11.44 \, \mu m^2$$

This results in an increase of the surface area by 26% from the prior art.

Like the first embodiment, the surface area of the storage node electrode becomes maximum when the interval between the word line 323b and the field oxide film 302 is 0.35 μm and the length of the word line 323b is 0.7 μm. In this case, the surface area of the storage node electrode $S_{2(max)}$ becomes 14.56 μm$^2$ which is a 60% increase from the conventional one.

Figure 13:
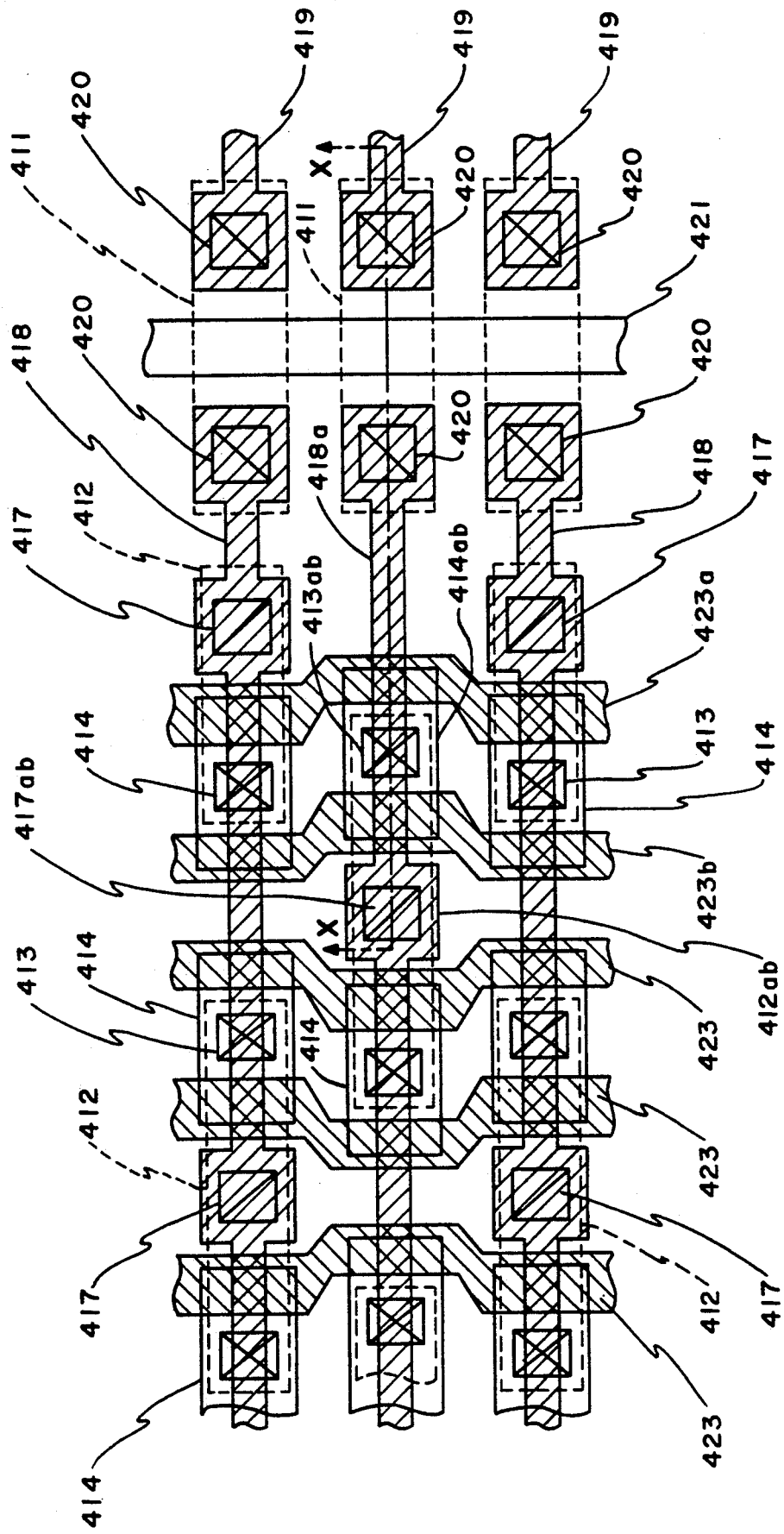
FIG. 13 is a schematic plane view to explain the third embodiment of this invention semiconductor memory device.
Figure 14A:
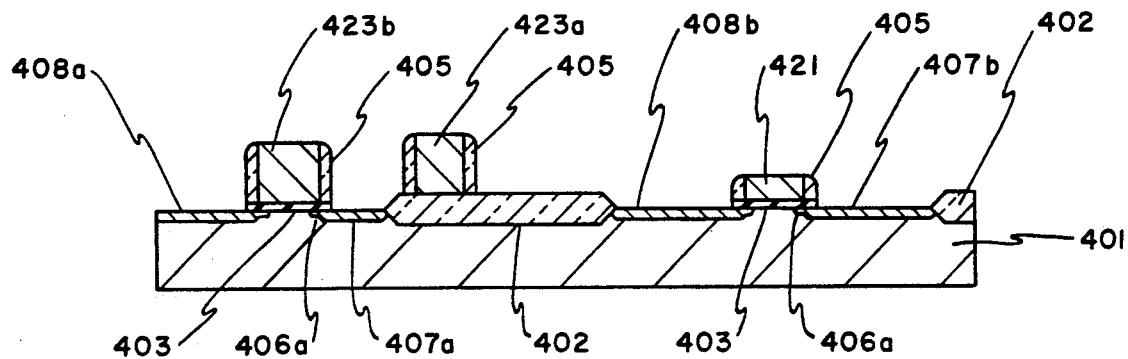
FIGS. 14A and 14B are cross sections along the line X—X in FIG. 13 to explain the manufacturing method of the third embodiment of this invention.
Figure 14B:
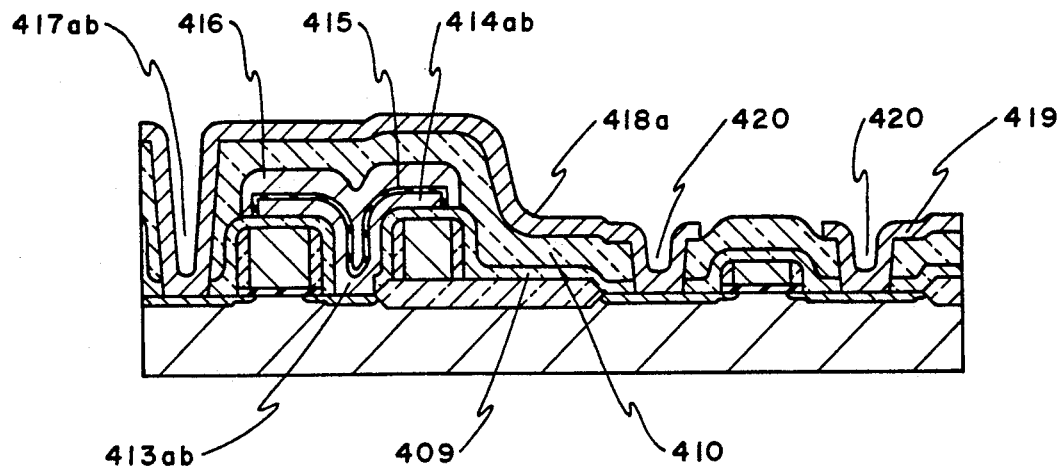

FIG. 13 is a schematic plane view to explain the third embodiment of this invention. FIGS. 14A and 14B are views to show processing steps of the manufacture of the DRAM of this invention, and more particularly substantial cross sections along the line X—X in FIG. 13.

The structure of the DRAM of this embodiment will now be described referring to FIG. 13.

A p-type silicon substrate is selectively provided with a field oxide film on the surface thereof, and active areas 411, 412, 412ab are formed surrounded by the field oxide films. Gate insulation films are provided on the surfaces of the active areas 411, 412 and 412ab. Word lines 423, 423a and 423b which are substantially parallel to each other are provided on the field oxide films and active areas. A gate electrode 421 is provided on the field oxide films and the active area 411 of the peripheral circuitry. The film thickness of all the word lines is identical and thicker than that of the gate electrode 411.

The active areas 412 and 412ab are provided with an N+ type diffused layer in a manner to be substantially self-matching with the word lines and with an N− type diffused layer in a manner self-matching therewith. The N+ type diffused layer and the N− type diffused layer, the gate insulation film and word lines form an LDD type transistor for the memory cell array. The active area 411 is provided with an N+ type diffused layer in a manner substantially self-matching with the gate electrode 421, and with an N− type diffused layer in a manner self-matching therewith. The N+ type diffused layer and the N− type diffused layer, the gate insulation film and the gate electrode 421 form an LDD type transistor for the peripheral circuitry.

The field oxide film and active areas 411, 412, 412ab and the gate electrode 411, and the word lines 423, 423a and 423b are covered on the surfaces thereof with the first insulation film between layers. The node contact holes 413 and 413ab are formed between adjacent word lines one of which exists on the field oxide film and the other of which exists on the active area to reach an N+ type diffused layer. The storage node electrodes 414, 414ab are connected to the N+ type diffused layer via node contact holes 413 and 413ab. The storage node electrode extends over two word lines on both sides of the N+ type diffused layer via the first insulation film which is connected to the N+ type diffused layer. For example, the storage node electrode 414ab is connected to the N+ type diffused layer via the node contact hole 413ab and extends over the word lines 423a and 423b via the first insulation film. The storage node electrodes 414, 414ab are covered with the capacitance insulation film on the surface thereof, and the surface of the capacitance insulation film in turn is covered with the cell plate electrodes. The storage node electrode, the capacitance insulation film and the cell plate electrodes form a stacked type capacitor for storing electric charges of this embodiment.

The surfaces of the stacked type capacitor for electric charge storage and of the first insulation film are covered with the second insulation film. Bit contact holes 417 and 417ab are formed to reach the N+ type diffused layer on the field oxide film on the side not adjacent to the word line on an active area. For example, in the active area 412ab, the bit contact hole 417ab is formed between the word lines 423 and 423b. At the peripheral circuitry, a contact hole 420 is formed for the N+ type diffused layer in the active area 411. Bit lines 418, 418a and a metal wiring 419 are formed on the second insulation film. The bit line 418 is connected to the N+ type diffused layer of the active areas 412 and 411 via the bit contact hole 417 and the contact hole 420. The bit line 418a is connected to the N+ type diffused layer of the active areas 412, 412ab and 411 via the bit contact holes 417 and 417ab and the contact hole 420. The bit lines 418, 418a and the word lines intersect each other substantially orthogonally via the first and second insulation films.

Referring to FIGS. 13, 14A and 14B, the manufacturing method of the DRAM of this invention will be described.

The surface of a p-type silicon substrate 401 is selectively oxidized to form a field oxide film 402 of about 500 nm thickness. This forms active areas 411, 412ab and 412 on the surface of the p-type silicon substrate 401. A gate insulation film 403 is formed on the surface of the active areas by thermal oxidation to the thickness of about 20 nm with a silicon oxide film. The entire surface is formed with an N+ type polycrystal silicon film of the thickness of about 1000 nm to cover the memory cells with a photoresist film. By etching the polycrystal silicon film using the photoresist film as a mask, an N+ type polycrystal silicon film of about 400 nm thickness is formed on the peripheral circuitry. The photoresist film is then removed, and using another photoresist film as a mask, the polycrystal silicon film is etched to form the word lines 423, 423a, and 423b. Ions are injected at the energy of 30 kev and at the does $1 \times 10^{13}$ cm$^{-2}$ using the word lines 423, 423a and 423b as masks to form N− type diffused layers 406a and 406b. By CVD method, a silicon oxide film is deposited at the thickness of about 200 nm. The silicon oxide film is etched back to form a spacer 405 on the side walls of the word lines 423, 423a, and 423b and the gate electrode 421 [FIGS. 14A and 12].

N+ type diffused layers 407a, 407b, 408a and 408b are formed by injecting As ions at $10^{15}$ cm$^{-2}$. The first insulation film 409 is formed with a silicon oxide film by CVD method at the thickness of about 200 nm. The first insulation film 409 which is immediately above the N+ type diffused layer 407a and the gate insulation film 403 are sequentially etched to form a node contact hole 413ab (and a node contact hole 413). An N+ type polycrystal silicon film is deposited over the entire surface at the thickness of about 300 nm, which is then patterned to form a storage node electrode 414ab (and a storage node electrode 414). The surface of the storage node electrode 414ab (and the storage node electrode 414) is thermally oxidized to form a capacitance insulation film 415 with about 15 nm thick silicon oxide film. A polycrystal silicon film of N+ type is deposited over the entire surface at the thickness of about 300 nm, which is patterned to form a cell plate electrode 416. By CVD method, the second insulation film 410 is formed over the entire surface with a silicon oxide film of about 500 nm thickness. The second insulation film 410 which is immediately above the N+ type diffused layer 408a, the first insulation film 409 and the gate insulation film 404 are sequentially etched to form a bit contact hole 417ab (and a bit contact hole 417). Simultaneously, the second insulation film 410 which is immediately above the N+ type diffused layers 407b and 408b, the first insulation film 409 and the gate insulation film 403 are sequentially etched to form a contact hole 420. Tungsten silicide film is deposited over the entire surface with the thickness of about 300 nm, which is then patterned to form a bit line 418a (and a bit line 418) and the metal wiring 419 [FIGS. 14B and 13].

The surface area S$_3$ of the storage node electrode in this embodiment will now be described. The shape of the storage node electrode in this embodiment is identical to that of the storage node electrode in the second embodiment application. This means that the surface area of the embodiment is larger than the prior art type by 26%.

As the film thickness of the word lines is the same, they can be formed more easily than the first and second embodiments.

Figure 15A:
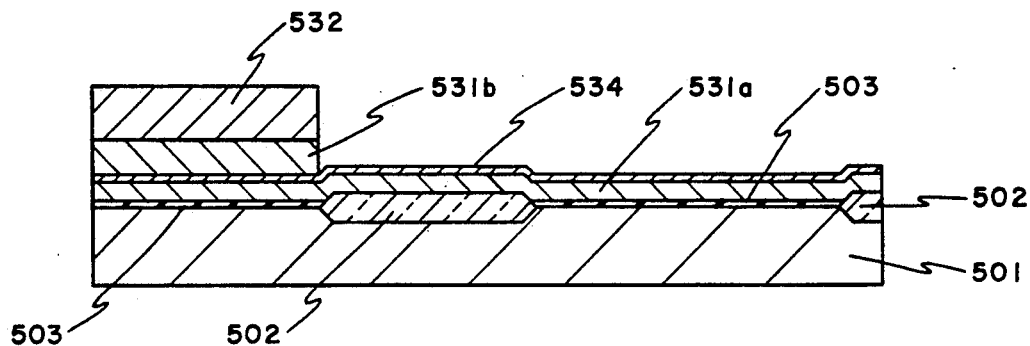
FIGS. 15A through 15C are schematic cross sections to explain the flow of the processing steps of the fourth embodiment of the semiconductor memory device according to this invention.
Figure 15B:
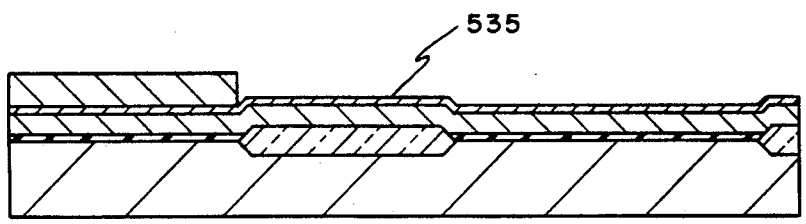
Figure 15C:
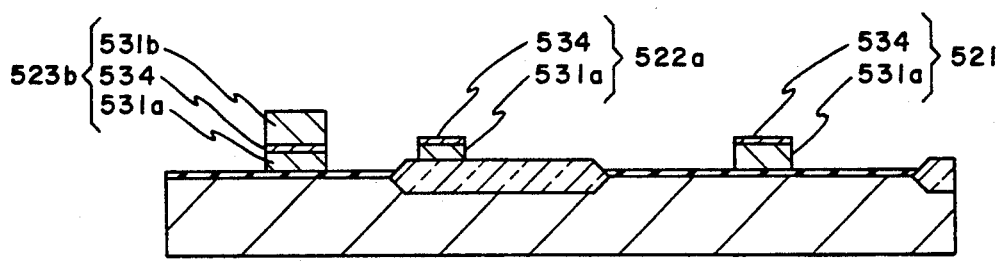

FIGS. 15A through 15C are cross sectional views to explain the processing steps of the fourth embodiment of the semiconductor memory device of this invention. As this embodiment is characterized by the structural materials of the word lines and the gate electrodes, description will mainly focus on the formation of the word lines and the gate electrodes. Although description is given by exemplifying a case wherein the structure is similar to that of the first embodiment, it is applicable to the second and the third embodiments.

A field oxide film 502 of about 500 nm thickness is formed on the surface of a p-type silicon substrate 501, to thereby form active areas on the surface of the substrate 501. On the surface of the active areas are formed a gate insulation film 503 with a silicon oxide film of 20 nm thickness by thermal oxidation. An N+ type polycrystal silicon film 531a of about 300 nm thickness, a tungsten film 534 of about 100 nm thickness, and a non-doped polycrystal silicon film 531b of about 600 nm thickness are successively deposited over the entire surface. A photoresist film 532 is formed to cover at least a part of the active areas of the memory cell array. By using the photoresist film 532 as a mask, a non-doped polycrystal silicon film 531b is etched [FIG. 15A]. After removing the photoresist film 532, it is thermally processed in the nitrogen atmosphere, a tungsten silicide film 535 is formed [FIG. 15B].

Then, another photoresist film is formed and used as a mask for etching to form word lines 523b and 522a and a gate electrode 521. The word lines 523b of the thicker film comprises a non-doped polycrystal silicon film 531b, a tungsten silicide film 535 and an N+ type polycrystal silicon film 531a. The word lines 522a and the gate electrode 521 comprise a tungsten silicide film 534 and a polycrystal silicon film 531a [FIG. 15C].

In this embodiment, the word lines with a thicker film and the gate electrode are formed more easily compared to the second and third embodiments because when the surface is etched to leave intact the thicker film, metal films with higher melting points such as a tungsten film function as stoppers for the etching.

Although the invention has been described with reference to specific embodiments, this description is not meant to be construed in a limiting sense. Various modifications of the disclosed embodiment as well as other embodiments of the invention will become apparent to persons skilled in the art upon reference to the description of the invention. It is therefore contemplated that the appended claims will cover any modification or embodiment as fall within the turn scope of the invention.

I claim:

1. A semiconductor memory device comprising a silicon substrate of one conductivity type, a field oxide film formed on a surface of said substrate, said field oxide film defining active areas for memory cells formed on the surface of said substrate and surrounded by said field oxide film, gate insulating films for memory cells formed on said active areas, a plurality of word lines formed substantially parallel to one another on said gate insulating films and said field oxide film, a pair of opposite conductivity type diffused layers selectively formed in said active areas for memory cells in a manner which is self-aligning with respect to said word lines, a stacked capacitor for storing electric charges, said stacked capacitor having a storage node electrode which is connected to one of said opposite conductivity type diffused layers via a node contact hole in the gate insulating film covering said one opposite conductivity type diffused layer, said storage node electrode having a first end portion which extends over at least a part of a first one of said word lines formed on the gate insulating films for memory cells and a second end portion which extends over at least a part of a second one of said word lines formed on said field oxide film, a plurality of bit lines which are substantially parallel to each other and which intersect said word lines substantially orthogonally, said field oxide film further defining active areas for peripheral circuitry, gate insulating films for peripheral circuitry formed on said active areas for the peripheral circuitry, gate electrodes for peripheral circuitry formed on said gate insulating films for peripheral circuitry and being elongated over said field oxide film, and opposite conductivity type diffused layers selectively formed in said active areas for peripheral circuitry in a manner which is self-aligning with respect to said gate electrodes for peripheral circuitry, wherein at least a part of said word lines on said active areas for memory cells has a film thickness which is greater than a thickness of said gate electrode for the peripheral circuitry.

2. The semiconductor memory device as claimed in claim 1, wherein only a part of said word lines on said active areas for memory cells has a larger film thickness than that of said gate electrode.

3. The semiconductor memory device as claimed in claim 1, wherein only a part of said word lines on said active areas for memory cells and only a part of said word lines adjacent to said node contact hole on said field oxide film has a larger film thickness than that of said gate electrode.

4. The semiconductor memory device as claimed in claim 1, wherein all of said word lines have a larger film thickness than that of said gate electrode.

5. The semiconductor memory device as claimed in claim 2, wherein at least a part of steps formed on said word lines due to the difference in film thickness is covered by said storage node electrode.

6. The semiconductor memory device as claimed in claim 3, wherein at least a part of steps formed on said word lines due to the difference in film thickness is covered by said storage node electrode.

7. The semiconductor memory device as claimed in claim 2, wherein said word lines intersect said bit lines on said field oxide film.

8. The semiconductor memory device as claimed in claim 2, wherein word lines other than those having the larger film thickness than that of said gate electrode and said gate electrode are formed as a polycide film of silicide film of metals of high melting points and polycrystal silicon film, said word lines having the film thickness larger than that of said gate electrode are formed as a polycide structure of polycrystal silicon film, metal silicide of high melting points and polycrystal silicon film.

9. The semiconductor memory device as claimed in claim 3, wherein said word lines except for those having the film thickness larger than that of said gate electrode and said gate electrode are formed as a polycide structure of metal silicide film of high melting points and polycrystal silicon film, and said word lines having the film thickness larger than that of said gate electrode are formed as a polycide structure of polycrystal silicon film, metal silicide film of high melting points and a polycrystal silicon film.

10. The semiconductor memory device as claimed in claim 5, wherein said word lines except those having the film thickness larger than that of said gate electrode and said gate electrode are formed as a polycide structure of metal silicide film of high melting points and polycrystal silicon film, and said word lines having the film thickness larger than said gate electrode is formed as a polycide structure of polycrystal silicon film, metal silicide of high melting points and polycrystal silicon film.

11. The semiconductor memory device as claimed in claim 6, wherein said word lines other than those having the film thickness larger than that of said gate electrode are structured as a polycide of the high melting point metal silicide film and polycrystal silicon film, and said word lines having the film thickness larger than that of said gate electrode are structured as a polycide of polycrystal silicon film, high melting point metal silicide film and polycrystal silicon film.

12. The semiconductor memory device as claimed in claim 7, wherein said word lines except for those having the film thickness larger than that of said gate electrode and said gate electrode are structured as a polycide of high melting point metal silicide film and polycrystal silicon film, and said word lines having the film thickness larger than that of said gate electrode are structured as a polycide of polycrystal silicon film, high melting point metal silicide film and polycrystal silicon film.

13. The semiconductor memory device as claimed in claim 4, wherein said word lines are structured as a polycide of the high melting point metal silicide film and polycrystal silicon film and said gate electrode is structured as a polycide of high melting point silicide film and polycrystal silicon film.

14. The semiconductor memory device as claimed in claim 1, wherein said gate insulation film for memory cells is thicker than said gate insulation film for peripheral circuitry.

15. The semiconductor memory device as claimed in claim 2, wherein said gate insulation film for memory cells is thicker than said gate insulation film for peripheral circuitry.

16. The semiconductor memory device as claimed in claim 3, wherein said gate insulation film for memory cells is thicker than said gate insulation film for peripheral circuitry.

17. The semiconductor memory device as claimed in claim 4, wherein said gate insulation film for memory cells is thicker than said gate insulation film for peripheral circuitry.

18. The semiconductor memory device as claimed in claim 5, wherein said gate insulation film for memory cells is thicker than said gate insulation film for peripheral circuitry.

19. The semiconductor memory device as claimed in claim 6, wherein said gate insulation film for memory cells is thicker than said gate insulation film for peripheral circuitry.

20. The semiconductor memory device as claimed in claim 7, wherein said gate insulation film for memory cells is thicker than said gate insulation film for peripheral circuitry.

21. The semiconductor memory device as claimed in claim 8, wherein said gate insulation film for memory cells is thicker than said gate insulation film for peripheral circuitry.

22. The semiconductor memory device as claimed in claim 9, wherein said gate insulation film for memory cells is thicker than said gate insulation film for peripheral circuitry.

23. The semiconductor memory device as claimed in claim 10, wherein said gate insulation film for memory cells is thicker than said gate insulation film for peripheral circuitry.

24. The semiconductor memory device as claimed in claim 11, wherein said gate insulation film for memory cells is thicker than said gate insulation film for peripheral circuitry.

25. The semiconductor memory device as claimed in claim 12, wherein said gate insulation film for memory cells is thicker than said gate insulation film for peripheral circuitry.

26. The semiconductor memory device as claimed in claim 13, wherein said gate insulation film for memory cells is thicker than said gate insulation film for peripheral circuitry.

* * * * *